(12) United States Patent
Fukuda

(10) Patent No.: US 7,602,657 B2
(45) Date of Patent: Oct. 13, 2009

(54) SEMICONDUCTOR MEMORY DEVICE HAVING FLOATING BODY CELL

(75) Inventor: Ryo Fukuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 142 days.

(21) Appl. No.: 11/950,097

(22) Filed: Dec. 4, 2007

(65) Prior Publication Data

US 2008/0130358 A1 Jun. 5, 2008

(30) Foreign Application Priority Data

Dec. 4, 2006 (JP) ............................. 2006-327227

(51) Int. Cl.
*G11C 7/00* (2006.01)
(52) U.S. Cl. .................. 365/190; 365/205; 365/206; 365/207
(58) Field of Classification Search .............. 365/190, 365/205, 206, 207
See application file for complete search history.

(56) References Cited

U.S. PATENT DOCUMENTS 7,313,041 B1 * 12/2007 Chapman et al. ............ 365/207
7,376,031 B2 * 5/2008 Ohsawa ...................... 365/207

OTHER PUBLICATIONS

Takashi Ohsawa, et al., "Design of a 128-Mb SOI DRAM Using the Floating Body Cell (FBC)", IEEE Journal of Solid-State Circuits, vol. 41, No. 1, Jan. 2006, pp. 135-145.
Takashi Ohsawa, et al., "An 18.5ns 128Mb SOI DRAM with a Floating Body Cell", IEEE International Solid-State Circuits Conference (ISSCC 2005), Session 25, Dynamic Memory, 25.1, Feb. 9, 2005, pp. 458-459 and 609.

* cited by examiner

*Primary Examiner*—Pho M. Luu
(74) *Attorney, Agent, or Firm*—Oblon, Spivak, McClelland, Maier & Neustadt, L.L.P.

(57) ABSTRACT

A semiconductor memory device includes a sense amplifier for the FBC, a first node and a second node can be disconnected from each other by a first isolation transistor. A third node and a fourth node can be disconnected from each other by a second isolation transistor. The first node is connected to the first memory cell. The third node is connected to the second memory cell. A first amplification transistor and a second amplification transistor are connected between the first node and the third node. A third amplification transistor and a fourth amplification transistor are connected between the second node and the fourth node. This enables to parallelly execute read data transfer to the data lines and precharge to prepare for the next read operation.

10 Claims, 9 Drawing Sheets

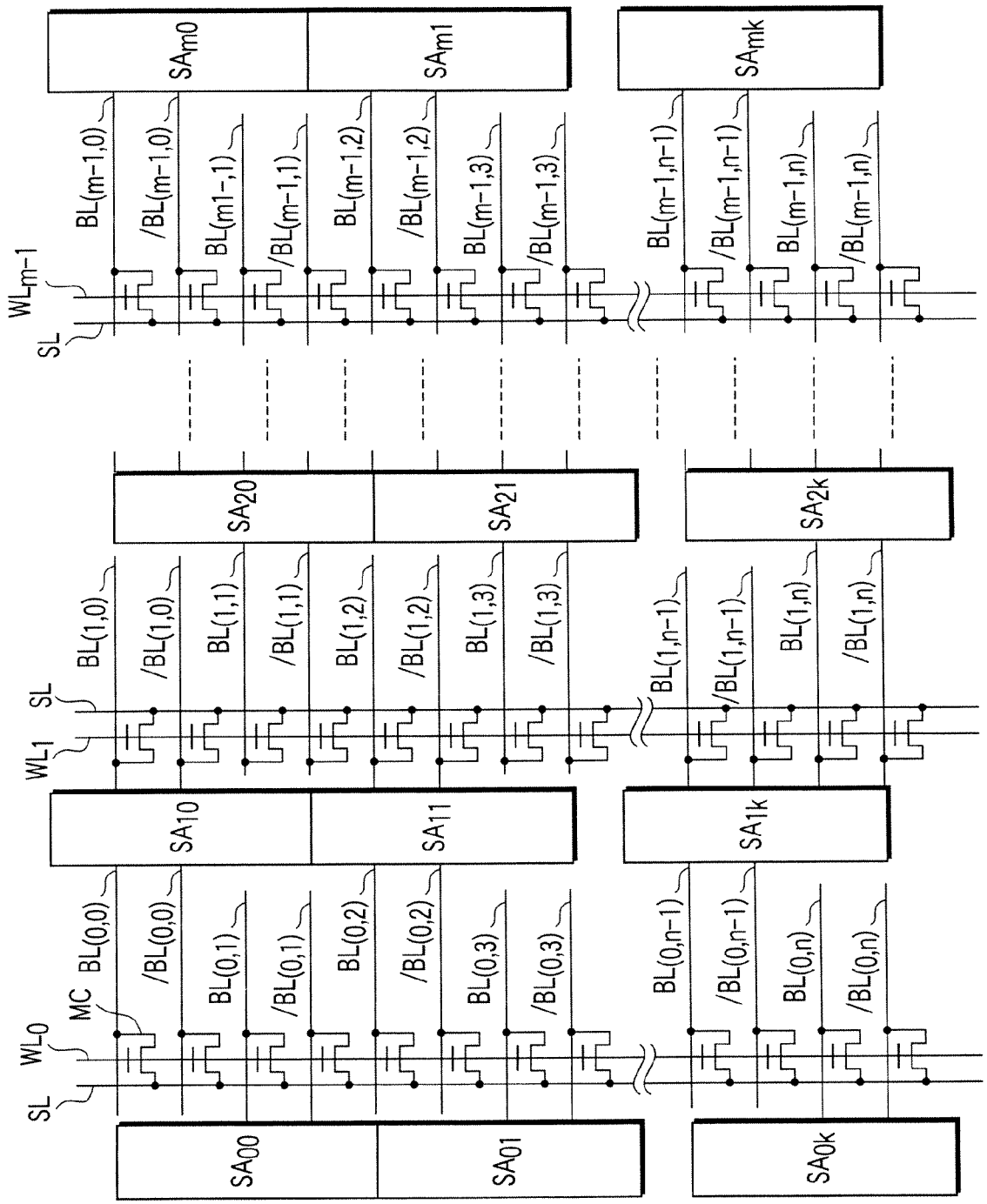
F I G. 1

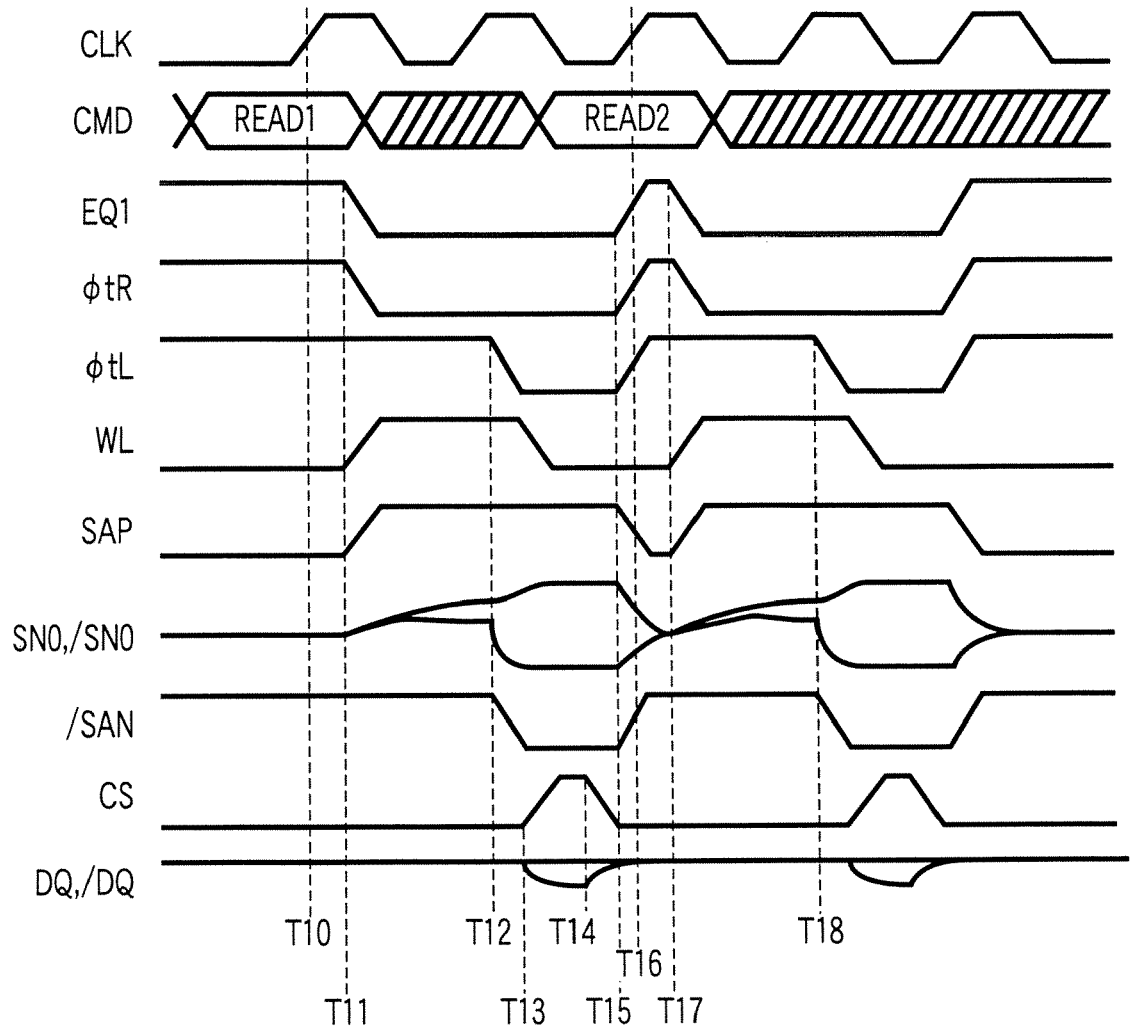
F I G. 10

SEMICONDUCTOR MEMORY DEVICE HAVING FLOATING BODY CELL

CROSS-REFERENCE TO RELATED APPLICATIONS

This application is based upon and claims the benefit of priority from prior Japanese Patent Application No. 2006-327227, filed Dec. 4, 2006, the entire contents of which are incorporated herein by reference.

BACKGROUND OF THE INVENTION

1. Field of the Invention

The present invention relates to a semiconductor memory device and, for example, to the sense amplifier circuit of a semiconductor memory device having floating body cells.

2. Description of the Related Art

Recently, a memory cell called a floating body cell (FBC) has received attention as a memory cell of a semiconductor memory device (e.g., Takashi Ohsawa et al., "An 18.5 ns 128 Mb SOI DRAM with a Floating Body Cell", "ISSCC 2005 Digest of Technical Papers", pp. 458-459). An FBC is formed on a silicon-on-insulator (SOI) substrate. The FBC accumulates charges in an SOI body region and associates the presence/absence of charges with binary digits 1 and 0, thereby storing data. The SOI technology is effective for micropatterning of a semiconductor memory device because the signal does not decrease along with the progress of micropatterning of the device.

The FBC is capable of nondestructive read, although it is volatile and requires refresh. It is also necessary to write back read data because of charge-pumping and the like. Hence, a semiconductor memory device using FBCs requires a sense amplifier that satisfies the above conditions, and sense amplifiers meeting the above requirements have been proposed.

BRIEF SUMMARY OF THE INVENTION

According to a first aspect of the present invention, there is provided a semiconductor memory device comprising: a first memory cell and a second memory cell each of which includes an electrically floating body region and stores data in accordance with the number of majority carriers in the body region, the first memory cell and the second memory cell storing data with opposite polarities; a first isolation transistor which has one terminal serving as a first node connected to the first memory cell and the other terminal serving as a second node; a second isolation transistor which has one terminal serving as a third node connected to the second memory cell and the other terminal serving as a fourth node; a first amplification transistor of a first conductivity type, which has one terminal connected to the first node and a gate electrode connected to the third node; a second amplification transistor of the first conductivity type, which has one terminal connected to the third node, the other terminal connected to the other terminal of the first amplification transistor, and a gate electrode connected to the first node; a third amplification transistor of a second conductivity type, which has one terminal connected to the second node and a gate electrode connected to the fourth node; a fourth amplification transistor of the second conductivity type, which has one terminal connected to the fourth node, the other terminal connected to the other terminal of the third amplification transistor, and a gate electrode connected to the second node; and an equalizing transistor which is connected between the first node and the third node.

According to a second aspect of the present invention, there is provided a semiconductor memory device comprising: a first memory cell and a second memory cell each of which includes an electrically floating body region and stores data in accordance with the number of majority carriers in the body region, the first memory cell and the second memory cell storing data with opposite polarities; a first isolation transistor which has one terminal serving as a first node connected to the first memory cell and the other terminal serving as a second node; a second isolation transistor which has one terminal serving as a third node connected to the second memory cell and the other terminal serving as a fourth node; a first amplification transistor of a first conductivity type, which has one terminal connected to the first node and a gate electrode connected to the third node; a second amplification transistor of the first conductivity type, which has one terminal connected to the third node, the other terminal connected to the other terminal of the first amplification transistor, and a gate electrode connected to the first node; a third amplification transistor of a second conductivity type, which has one terminal connected to the second node and a gate electrode connected to the fourth node; a fourth amplification transistor of the second conductivity type, which has one terminal connected to the fourth node, the other terminal connected to the other terminal of the third amplification transistor, and a gate electrode connected to the second node; a fifth amplification transistor of the first conductivity type, which has one terminal connected to the second node and a gate electrode connected to the fourth node; a sixth amplification transistor of the first conductivity type, which has one terminal connected to the fourth node, the other terminal connected to the other terminal of the fifth amplification transistor, and a gate electrode connected to the second node; a first equalizing transistor which is connected between the first node and the third node; and a second equalizing transistor which is connected between the second node and the fourth node.

BRIEF DESCRIPTION OF THE SEVERAL VIEWS OF THE DRAWINGS

FIG. 1 is a circuit diagram showing the arrangement of a semiconductor memory device according to a first embodiment;

FIG. 10 is a timing chart showing the potentials of the respective units of the sense amplifier shown in FIG. 9.

DETAILED DESCRIPTION OF THE INVENTION

The present inventors studied a sense amplifier for an FBC in the process of developing the present invention and obtained the following findings.

Figure 9:
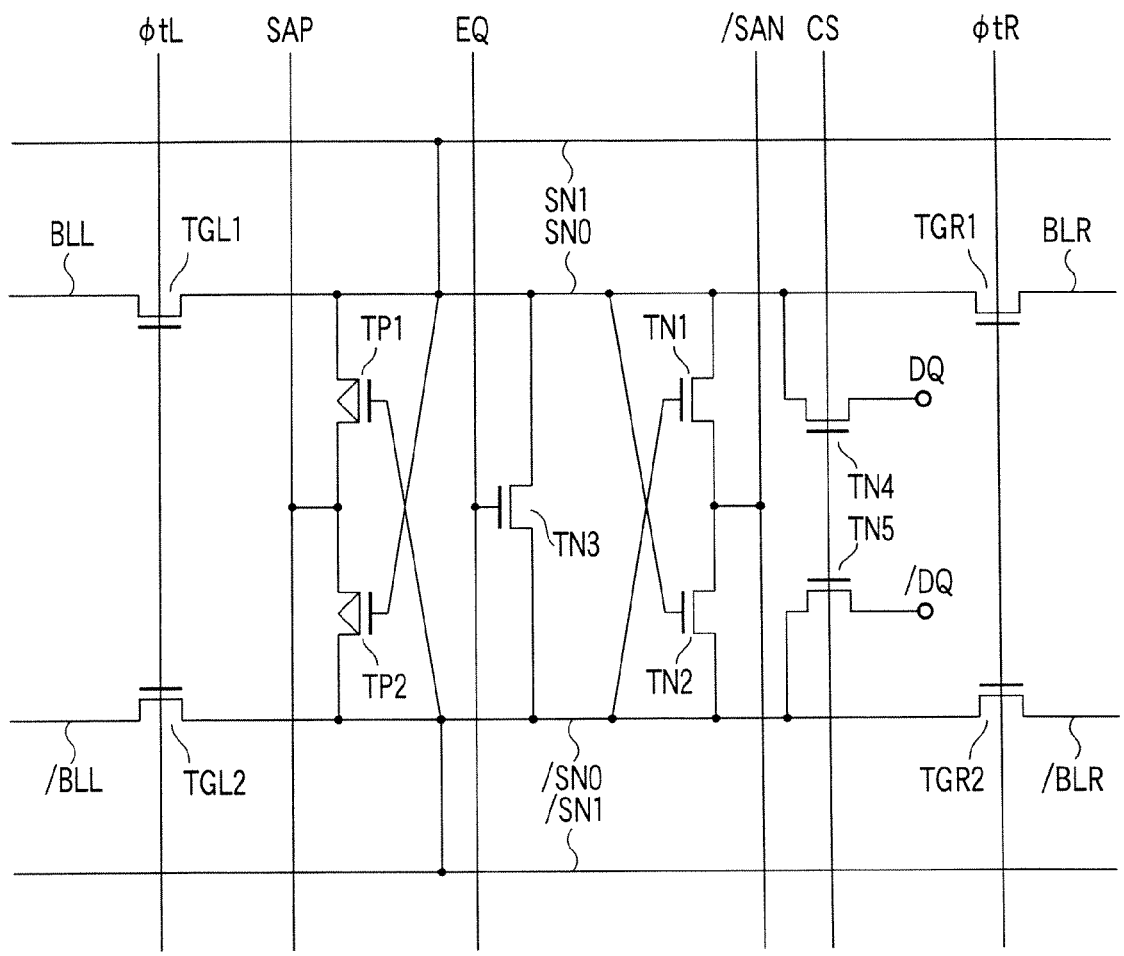
FIG. 9 is a circuit diagram schematically showing a sense amplifier for an FBC.

FIG. 9 schematically shows a sense amplifier for an FBC. FIG. 10 is a timing chart showing the potentials of the respective units in FIG. 9. As shown in FIGS. 9 and 10, bit lines BLL and /BLL complementary to each other are connected to nodes SN and /SN via transistors TGL1 and TGL2, respectively. A memory cell (not shown) to hold data complementary to each other is connected to bit lines BLL and /BLL. After a read command READ1 externally supplied to a semiconductor memory device including a sense amplifier is captured at time T10, a word line connected to the gate of the memory cell is asserted at time T11.

At time T11, signal φtR is negated. Transistor TGR1 and TGR2 are turned off to disconnect nodes SN0 and /SN0 from bit lines BLR and /BLR. Additionally, at time T11, signal EQ is negated. A transistor TN3 connected between nodes SN0 and /SN0 is turned off so that they are disconnected from each other.

When the signals thus change at time T11, the potential of the memory cell is read to nodes SN0 and /SN0 via bit lines BLL and /BLL.

At time T11, signal SAP is also asserted. Signal SAP is supplied to the connection node of transistors TP1 and TP2 which are cross-coupled between nodes SN0 and /SN0. As a result, transistors TP1 and TP2 start an amplifying operation, and the potential of nodes SN0 and /SN0 rises.

After the potential of nodes SN0 and /SN0 sufficiently rises, signal /SAN is asserted at time T12. Signal /SAN is supplied to the connection node of transistors TN1 and TN2 which are cross-coupled between nodes SN0 and /SN0. As a result, transistors TN1 and TN2 start an amplifying operation, and the potential of nodes SN0 and /SN0 further rises. Transistors TN1 and TN2 raise or lower the potential of nodes SN0 and /SN0 within the full range and latch the state.

After the potential of nodes SN0 and /SN0 changes within the full range, column selection signal CS is asserted at time T13. Consequently, the potential of nodes SN0 and /SN0 is transferred to data lines DQ and /DQ via transistors TN4 and TN5. When the column selection signal CS is negated at time T14, nodes SN0 and /SN0 are disconnected from the data lines DQ and /DQ, respectively.

Consider specifications in which another read command READ2 is supplied two cycles after (after two periods of the clock signal) the read command READ1 to increase the efficiency of data read from the semiconductor memory device.

Upon receiving the second read command, signal EQ is asserted at time T15, i.e., as soon as possible after the elapse of time for sufficiently transferring the charges to the data lines DQ and /DQ, thereby preparing for read by the command. Then, precharge of nodes SN0 and /SN0 starts.

At time T15, signals SAP and /SAN are negated to finish the amplifying operation. Simultaneously, signals φtL and φtR are asserted to connect nodes SN0 and /SN0 to bit lines BLL, /BLL, BLR, and /BLR. At time T16, the read command READ2 is captured.

At time T17, to transfer charges from the memory cell again, the signals change in the same manner as at time T11. That is, signal EQ is negated to finish precharge of nodes SN0 and /SN0. Signal φtR is negated to disconnect nodes SN0 and /SN0 from bit lines BLR and /BLR, respectively. Additionally, a word line WL is asserted.

At time T17, signal SAP is also asserted to start the amplifying operation by transistors TP1 and TP2.

In the second read, the time from the restart of precharge to amplification of charges in nodes SN0 and /SN0 by transistors TP1 and TP2, i.e., the interval between times T15 and T17 is not sufficient. More specifically, the interval between times T15 and T17 is shorter than the time from precharge to the start of node potential amplification without continuous read commands. Hence, the read data may be inverted.

This phenomenon occurs for the following reason. Data amplification by transistors TP1 and TP2 is executed to prevent inversion of read data due to use of a transistor larger than a small cell transistor. The time of amplification (signal development time) by transistors TP1 and TP2, i.e., the interval from time T11 to time T12 is set to such a length that generates a potential difference between nodes SN0 and /SN0 without data inversion upon amplification by transistors TN1 and TN2 regardless of the threshold variation between cell transistors. That is, the signal development time cannot be shorter because if it is short, read data is inverted.

This also applies to data amplification by transistors TN1 and TN2 and data transfer to the data lines DQ and /DQ. That is, amplification by transistors TN1 and TN2 and charge of the data lines DQ and /DQ also require predetermined lengths (times). Hence, the times cannot be shorter.

This influences the precharge time for the second read following these operations, and the second precharge time becomes short. When the precharge time is short, read data is inverted.

The embodiments of the present invention based on these findings will be described below with reference to the accompanying drawing. Note that in the following explanation, the same reference numerals denote elements having almost the same functions and arrangements, and a repetitive explanation will be made only when necessary.

FIRST EMBODIMENT

FIG. 1 is a circuit diagram showing the arrangement of a semiconductor memory device according to the first embodiment. The semiconductor memory device includes a plurality of sense amplifiers $SA_{00}$ to $SA_{mk}$ arranged on an array of k rows×m columns. If it is unnecessary to specify a sense amplifier, or if nonspecific sense amplifier should be indicated, they will generally be referred to as sense amplifiers SA hereinafter.

A plurality of bit lines $BL_{(0,0)}$ and $/BL_{(0,0)}$ to $BL_{(m-1,n)}$ and $/BL_{(m-1,n)}$ run in, e.g., the horizontal direction in FIG. 1. Bit lines with identical subscripts form a pair. A left subscript x indicates that a bit line is located between the xth sense amplifier SA and the (x+1)th sense amplifier SA counted from the left. A right subscript y indicates that a pair of bit lines corresponds to the yth row from the upper side. If it is unnecessary to specify a bit line, or if a nonspecific bit line should be indicated, they will be generally referred to as bit lines BL and /BL hereinafter.

Each of the pairs of bit lines BL and /BL is connected to only one of the two sense amplifiers SA located on the left and right sides. More specifically, between a sense amplifier SA of an odd-numbered column on the left side and a sense amplifier SA of an even-numbered column on the right side, the first pair of bit lines from the upper side is connected to the sense amplifier SA on the right side, and the second pair of bit lines from the upper side is connected to the sense amplifier SA on the left side. On the other hand, between a sense amplifier SA of an even-numbered column on the left side and a sense amplifier SA of an odd-numbered column on the right side, the first pair of bit lines from the upper side is connected to the sense amplifier SA on the left side, and the second pair of bit lines from the upper side is connected to the sense amplifier SA on the right side. As a result, each sense amplifier SA is connected to a pair of bit lines on each of the left and right sides (a total of four bit lines).

More specifically, between the sense amplifiers $SA_{00}$ and $SA_{10}$, bit lines $BL_{(0,0)}$ and $/BL_{(0,0)}$ are connected to the sense amplifier $SA_{10}$ on the right side, and bit lines $BL_{(0,1)}$ and $/BL_{(0,1)}$ are connected to the sense amplifier $SA_{00}$ on the left side.

A plurality of word lines $WL_0$ to $WL_{m-1}$ run in the vertical direction in FIG. 1. A subscript z indicates that a word line is located between the zth sense amplifiers SA and the (z+1)th sense amplifiers SA counted from the left. If it is unnecessary to specify a word line, they will be generally referred to as word lines WL hereinafter. Note that the directions in which bit lines BL and /BL and word lines WL run may be reversed.

Memory cells MC are provided at the intersections between bit lines BL and /BL and the word lines WL. That is, the memory cells MC are arranged in a matrix. Each memory cell MC is formed from an FBC and implemented by a transistor. One terminal of the transistor of each memory cell is connected to bit lines BL and /BL, and the other terminal is connected to a source line SL. The gates of the transistors of memory cells belonging to the same column are connected to the same word line WL.

The FBC memory device according to this embodiment employs a 2-cell/bit method. In the 2-cell/bit method, a bit is stored by writing data with opposite polarities in two memory cells MC connected to bit lines BL and /BL and the same word line WL. Data with opposite polarities indicate data having a complementary relationship such as binary 0 and binary 1.

In reading data, one of the data with opposite polarities is used as the reference to the other data, and vice versa. Hence, bit lines BL and /BL transmit data with opposite polarities.

Figure 2:
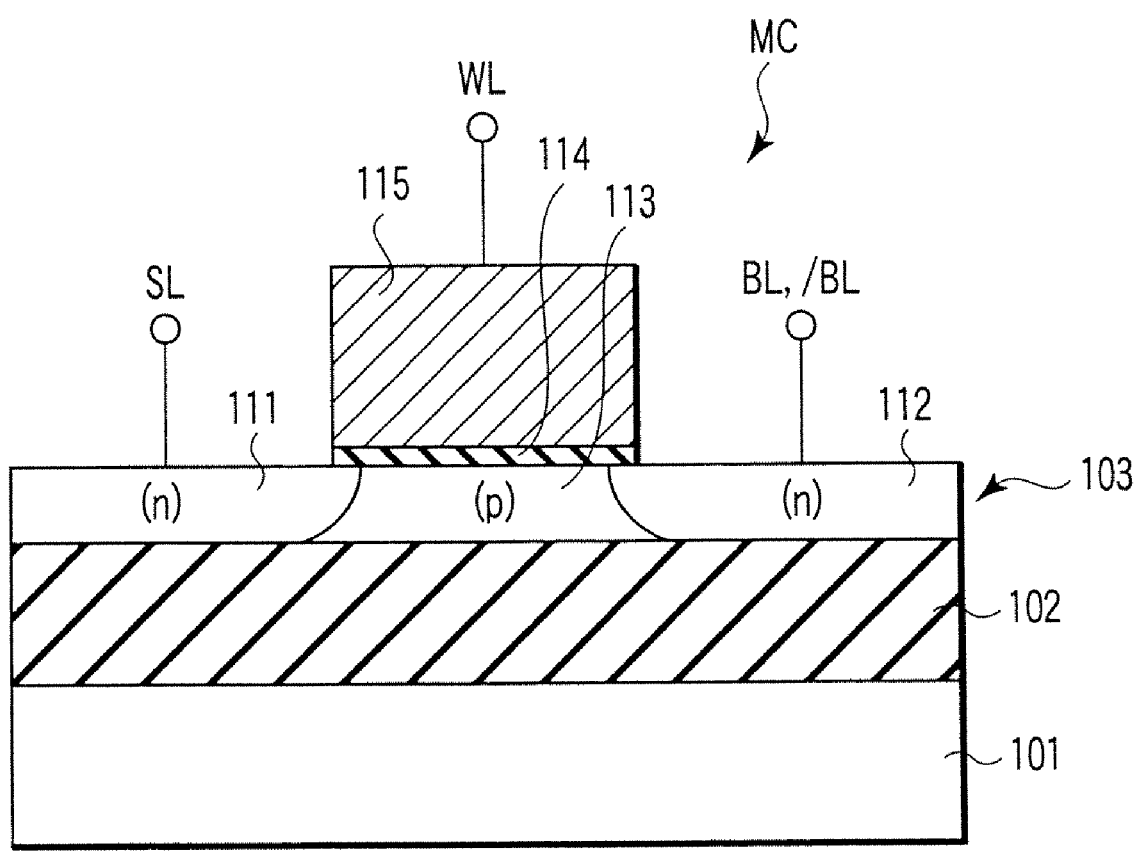
FIG. 2 is a sectional view showing a memory cell applicable to the first embodiment.

FIG. 2 is a sectional view schematically showing the memory cell MC applicable to the first embodiment. The memory cell MC is formed on an SOI substrate. The SOI substrate includes a support substrate 101, BOX layer 102, and SOI layer (silicon layer) 103 which are stacked.

A source region 111 and drain region 112 are formed in the SOI layer 103. A body region 113 is formed in the SOI layer 103 between the source region 111 and the drain region 112. The body region 113 has a conductivity type opposite to that of the source region 111 and drain region 112. The source region 111 is connected to the source line SL. The drain region 112 is connected to bit line BL or /BL. The source line SL is set at 0 V.

A gate insulating film 114 is formed on the body region 113. A gate electrode 115 is formed on the gate insulating film 114. The gate electrode 115 is connected to the word line WL.

In this embodiment, the memory cell MC is formed from an n-type metal oxide semiconductor field-effect transistor (MOSFET). The body region 113 surrounded by the source region 111, drain region 112, BOX layer 102, and gate insulating film 114, and an element isolation insulating film (not shown) with, e.g., a shallow trench isolation (STI) structure is electrically floating. The FBC memory stores data in accordance with the number of majority carriers in the body region 113.

For example, a state wherein many holes are accumulated in the body region 113 is defined as a binary 1 holding state. A state wherein few holes are accumulated there is defined as a binary 0 holding state. To write binary 1 to the memory cell MC, it is operated in a saturated state. More specifically, the word line WL is biased to, e.g., 1.5 V, and bit line BL is biased to, e.g., 1.5 V. As described above, 0 V is applied to the source region 111. Hence, impact ionization occurs near the drain region 112 to generate an enormous number of electron-hole pairs. The generated electrons flow to the drain region 112, while the generated holes are accumulated in the body region 113 with a low potential. When the current that flows upon hole generation by impact ionization balances with the forward current in the p-n junction between the body region 113 and the drain region 112, the voltage of the body region 113 attains an equilibrium. The body voltage is about 0.7 V.

To write binary 0, the voltage of bit line BL is dropped to a negative voltage. For example, the potential of bit line BL is set at −1.5 V. This operation biases the p-n junction between the body region 113 and the drain region 112 largely in the forward direction. As a result, the holes accumulated in the body region 113 are discharged to the drain region 112, and binary 0 is stored in the memory cell MC.

In the data read operation, the word line WL is asserted, as in the data write. However, the potential of bit lines BL and /BL is set to be lower than in writing binary 1. For example, the word line WL is set at 1.5 V, and bit lines BL and /BL are set at 0.2 V. As a result, the memory cell MC operates in a linear region. A memory cell MC holding binary 0 and a memory cell MC holding binary 1 have different threshold voltages because of the difference in the number of holes accumulated in the body region 113. Binary 1 and "0" are identified by detecting the difference between the threshold voltages. The reason why bit lines BL and /BL are set at a low voltage in the read is as follows. In reading binary 0, if the memory cell MC is biased to the saturated state by setting bit lines BL and /BL at a high voltage, the binary 0 changes to binary 1 because of impact ionization.

Figure 3:
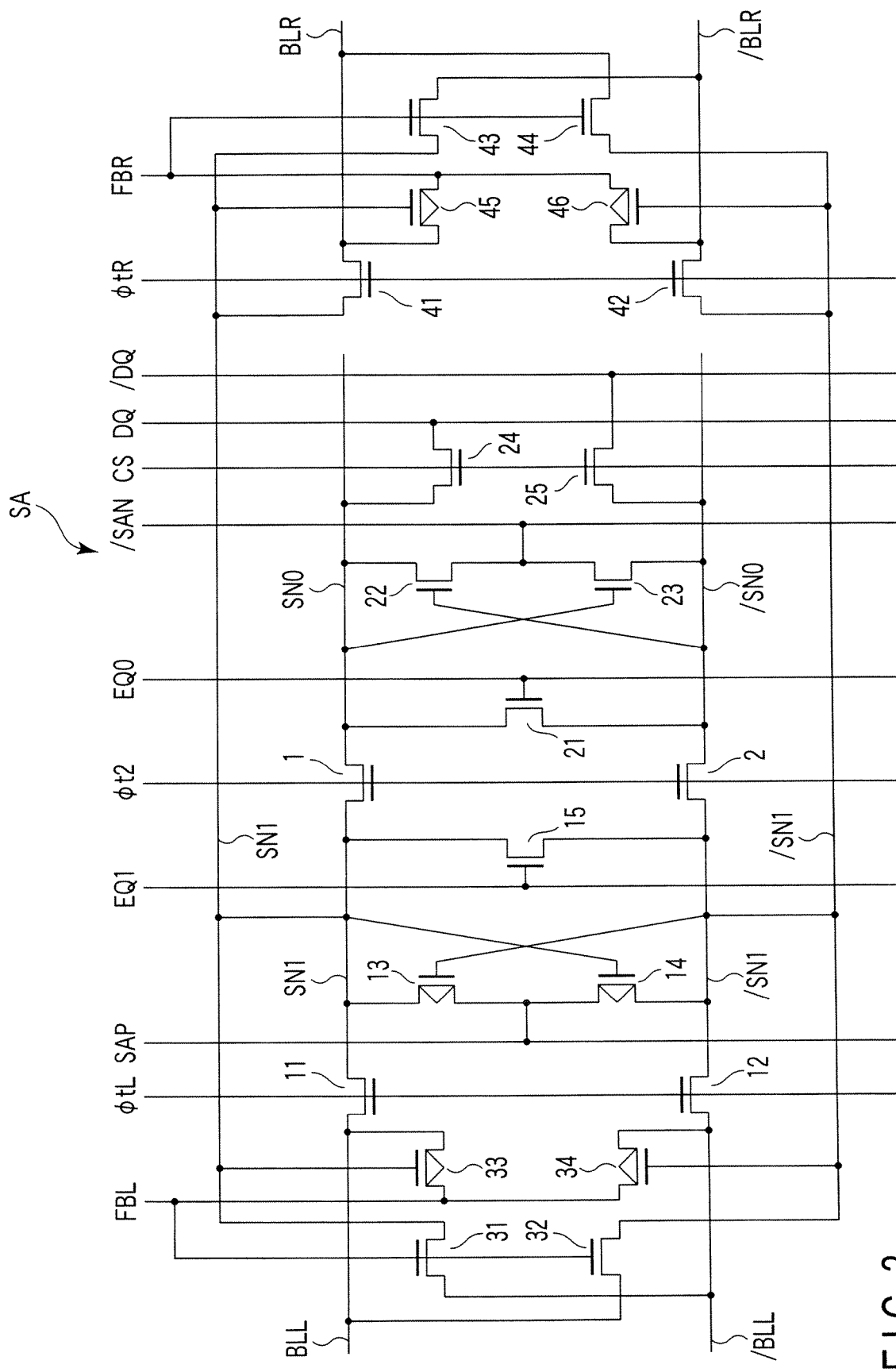
FIG. 3 is a circuit diagram showing the sense amplifier and its peripheral circuit in the semiconductor memory device according to the first embodiment.

The sense amplifier SA according to the first embodiment will be described next with reference to FIGS. 3 to 6. FIG. 3 is a circuit diagram showing the sense amplifier SA its and peripheral circuit in the semiconductor memory device according to the first embodiment. As shown in FIG. 3, the bit lines on the left side of the sense amplifier SA are called bit lines BLL and /BLL, and those on the right side are called bit lines BLR and /BLR. For, e.g., the sense amplifier $SA_{10}$ in FIG. 1, bit lines $BL_{(0,0)}$ and $/BL_{(0,0)}$ and bit lines $BL_{(1,0)}$ and $/BL_{(1,0)}$ in FIG. 1 correspond to bit lines BLL and /BLL and bit lines BLR and /BLR in FIG. 3, respectively.

Each of bit lines BLL and /BLL is connected to one terminal of a corresponding one of transistors (isolation transistors) 11 and 12. Transistors 11 and 12 are formed from, e.g., NMOSFETs. The other terminal of each of transistors 11 and 12 is connected to a corresponding one of sense amplifier nodes (to be simply referred to as nodes hereinafter) SN1 and /SN1. Transistor 11 controls connection or disconnection between bit line BLL and node SN1 in accordance with signal φtL. Transistor 12 controls connection or disconnection between bit line /BLL and node /SN1 in accordance with signal φtL.

Node SN1 is connected to bit line BLR via an NMOSFET 41. Node /SN1 is connected to bit line /BLR via an NMOSFET 42. Transistor 41 controls connection or disconnection between node SN1 and bit line BLR in accordance with signal φtR. Transistor 42 controls connection or disconnection between node /SN1 and bit line /BLR in accordance with signal φtR.

Cross-coupled PMOSFETs (amplification transistors) 13 and 14 are connected between nodes SN1 and /SN1. More specifically, transistors 13 and 14 are connected to each other at one terminal. The other terminal of transistor 13 is connected to the node SN1. The other terminal of transistor 14 is connected to node /SN1. The gate terminal of transistor 13 is connected to node /SN1. The gate terminal of transistor 14 is connected to node SN1. Signal SAP is supplied to one terminal of each of transistors 13 and 14 (the connection node between transistors 13 and 14).

Transistors 13 and 14 have a function of amplifying the signal difference between memory cell transistors. For this purpose, transistors 13 and 14 must have a small driving capability (size). More specifically, transistors 13 and 14 have a size equal to that of the memory cell transistor. To achieve micropatterning of the semiconductor memory device, the memory cell transistor has a small size, and therefore, the amount of a signal read to bit lines BL and /BL is small. Even memory cell transistors formed in the same process normally have a variation in the threshold. For this reason, if a small signal is amplified by using a transistor larger than the memory cell transistor, read data may be inverted because of the threshold variation. To prevent this, before data signal read by transistors 22 and 23 (to be described later), transistors 13 and 14 having a low driving capability amplify the small signal on bit lines BL and /BL without inversion of read data because of the influence of the threshold variation.

For example, an NMOSFET 15 is connected between nodes SN1 and /SN1. Transistor 15 has a function of deactivating the sense amplifier SA and precharging node /SN1. Signal EQ1 is supplied to the gate terminal of transistor 15. Transistor 15 short-circuits or disconnects node SN1 to or from node /SN1 in accordance with signal EQ1.

The other terminal of each of nodes SN1 and /SN1 is connected to one terminal of a corresponding one of, e.g., NMOSFETs 1 and 2. The other terminal of each of transistors (isolation transistors) 1 and 2 is connected to a corresponding one of sense amplifier nodes (to be simply referred to as nodes hereinafter) SN0 and /SN0. Signal ϕt2 is supplied to the gate terminals of transistors 1 and 2. Transistor 1 controls connection or disconnection between node SN1 and one terminal of the SN0 in accordance with signal ϕt2. Transistor 2 controls connection or disconnection between node /SN1 and one terminal of the /SN0 in accordance with signal ϕt2.

For example, an NMOSFET (equalizing transistor) 21 is connected between nodes SN0 and /SN0. Transistor 21 has a function of equalizing nodes SN0 and /SN0. Signal EQ0 is supplied to the gate terminal of transistor 21. Transistor 21 short-circuits or disconnects node SN0 to or from node /SN0 in accordance with signal EQ0.

The cross-coupled NMOSFETs (amplification transistors) 22 and 23 are connected between nodes SN0 and /SN0. More specifically, transistors 22 and 23 are connected to each other at one terminal. The other terminal of transistor 22 is connected to node SN0. The other terminal of transistor 23 is connected to node /SN0. The gate terminal of transistor 22 is connected to node /SN0. The gate terminal of transistor 23 is connected to node SN0. Signal /SAN is supplied to one terminal of each of transistors 22 and 23 (the connection node between transistors 22 and 23). Transistors 22 and 23 have a function of amplifying the signals on nodes SN0 and /SN0, respectively, and have a size larger than transistors 13 and 14.

Node SN0 is connected to a data line DQ via an NMOSFET 24. Node /SN0 is connected to a data line /DQ via an NMOSFET 25. A column selection signal CS is supplied to the gate terminals of transistors 24 and 25. Transistor 24 connects node SN0 to the data line DQ in accordance with signal CS. Transistor 25 connects node /SN0 to the data line /DQ in accordance with signal CS.

The sense amplifier for the FBC needs to apply data with a polarity opposite to that of a read signal to the bit line in, e.g., refresh. For this purpose, the sense amplifier SA has transistors 31 to 34 and 43 to 46. The NMOSFET 31 is connected between node SN1 and bit line /BLL. The NMOSFET 32 is connected between node /SN1 and bit line BLL. Signal FBL is supplied to the gate terminals of transistors 31 and 32.

The PMOSFET 33 is connected between bit line BLL and the supply line of signal FBL. The gate terminal of transistor 33 is connected to node SN1. The PMOSFET 34 is connected between bit line /BLL and the supply line of signal FBL. The gate terminal of transistor 34 is connected to node /SN1.

The NMOSFET 43 is connected between node SN1 and bit line /BLR. The NMOSFET 44 is connected between node /SN1 and bit line BLR. Signal FBR is supplied to the gate terminals of transistors 43 and 44.

The PMOSFET 45 is connected between bit line BLR and the supply line of signal FBR. The gate terminal of transistor 45 is connected to node SN1. The PMOSFET 46 is connected between bit line /BLR and the supply line of signal FBR. The gate terminal of transistor 46 is connected to node /SN1.

When signal FBL is asserted, data with a polarity opposite to that of data read to bit lines BLL and /BLL is applied to bit lines BLL and /BLL. As a result, data with the same polarity as that of the read data is written in the memory cell MC connected to bit lines BLL and /BLL.

Similarly, when signal FBR is asserted, data with a polarity opposite to that of data read to bit lines BLR and /BLR is applied to bit lines BLR and /BLR. As a result, data with the same polarity as that of the read data is written in the memory cell MC connected to bit lines BLR and /BLR.

Figure 4:
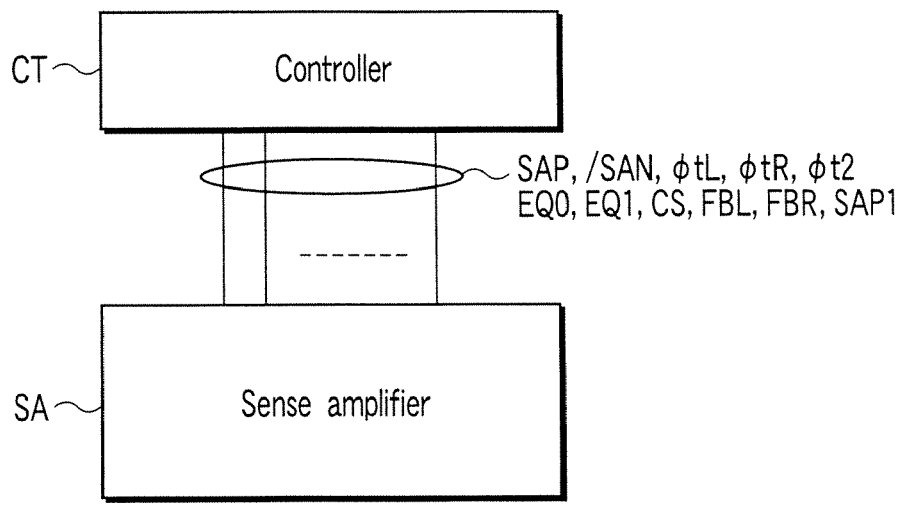
FIG. 4 is a view showing the relationship between a controller and signals supplied to the sense amplifier according to the first embodiment.

A controller CT supplies signals SAP, /SAN, ϕtL, ϕtR, ϕt2, EQ0, EQ1, CS, FBL, and FBR, as shown in FIG. 4. FIG. 4 shows the relationship between the controller and various kinds of signals supplied to the sense amplifier SA. Signal SAP1 will be explained in the second embodiment.

Figure 5:
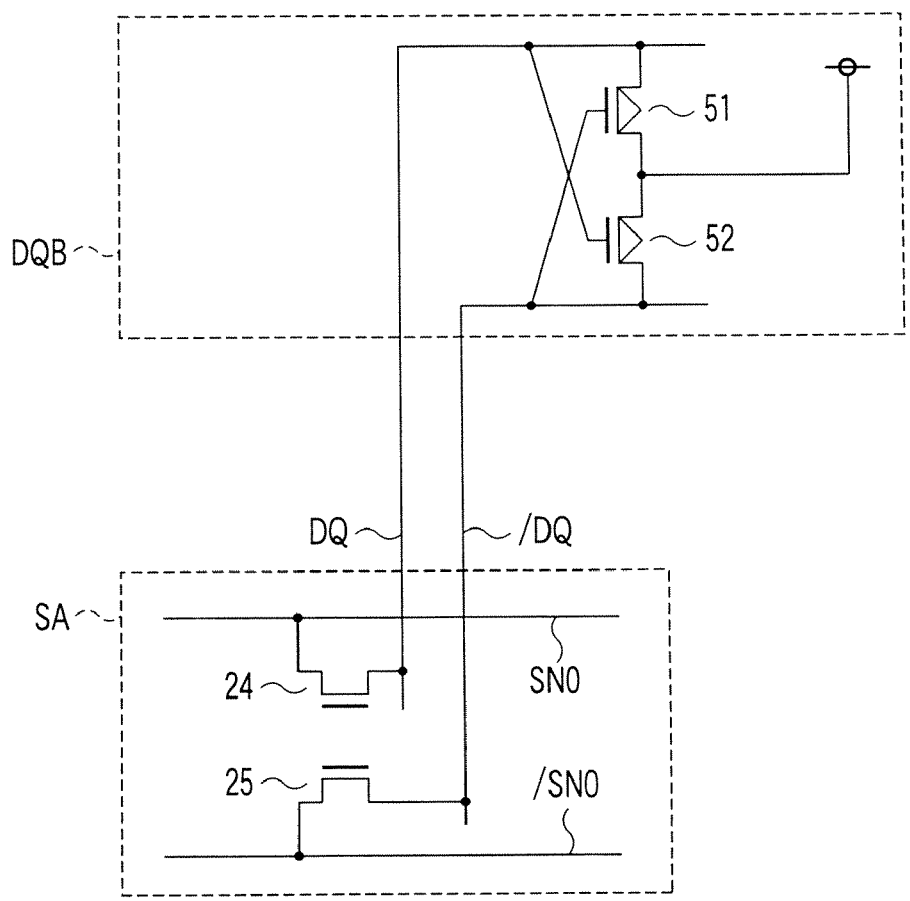
FIG. 5 is a view showing connection via data lines according to the first embodiment.

As shown in FIG. 5, the data lines DQ and /DQ are connected to a data buffer DQB. FIG. 5 shows connection via the data lines DQ and /DQ. The data buffer DQB further amplifies the potential of the data lines DQ and /DQ and outputs it from the semiconductor memory device.

The data buffer DQB has cross-coupled PMOSFETs 51 and 52 provided between the data lines DQ and /DQ. More specifically, transistors 51 and 52 are connected to each other at one terminal. The other terminal of transistor 51 is connected to the data line DQ. The other terminal of transistor 52 is connected to the data line /DQ. The gate terminal of transistor 51 is connected to the data line /DQ. The gate terminal of transistor 52 is connected to the data line DQ. A power supply potential is supplied to one terminal of each of transistors 51 and 52 (the connection node between transistors 51 and 52).

Figure 6:
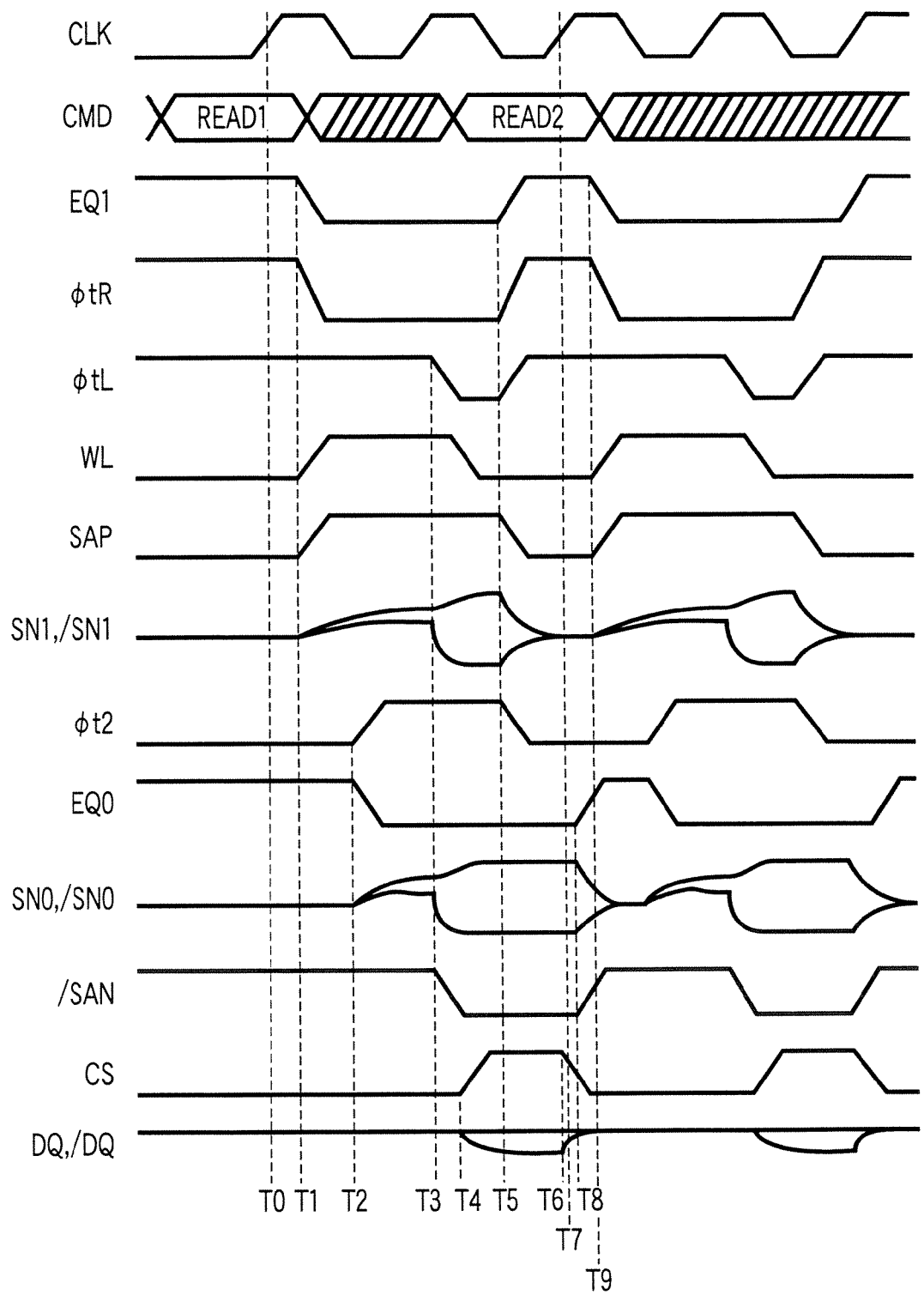
FIG. 6 is a timing chart showing the potentials of the respective units of the sense amplifier according to the first embodiment in a read mode.

The read operation of the sense amplifier SA shown in FIG. 3 will be described next with reference to FIG. 6. FIG. 6 is a timing chart showing the potentials of the respective units of the sense amplifier SA according to the first embodiment in a read mode. FIG. 6 exemplifies read from the memory cell MC on the left side of the sense amplifier SA, i.e., the memory cell MC connected to bit lines BLL and /BLL.

As shown in FIG. 6, in the standby state, signals ϕtL and ϕtR are asserted. Hence, bit line BLL, node SN1, and bit line BLR are connected to each other, and bit line /BLL, node /SN1, and bit line /BLR are connected to each other. On the other hand, signal ϕt2 is negated. Hence, nodes SN1 and /SN1 are disconnected from nodes SN0 and /SN0, respectively.

Assertion indicates that the asserted signal has a logic level to turn on a transistor that receives that signal. Hence, while a signal is being supplied to the gate terminal of an NMOSFET, the assertion level of the signal indicates high level. While the signal is being supplied to the gate terminal of a PMOSFET, the assertion level of the signal indicates low level.

In the standby state, signals EQ0 and EQ1 are asserted. Hence, nodes SN0 and /SN0 are at an equipotential, and nodes SN1 and /SN1 are at an equipotential.

Signals SAP and /SAN are negated to turn off transistors 13, 14, 22, and 23. Signal CS is also negated to disconnect nodes SN0 and /SN0 from the data lines DQ and /DQ, respectively.

At time T0, a read command READ1 externally supplied to the semiconductor memory device is captured. Accordingly, at time T1, signal EQ1 is negated to stop equalizing nodes SN1 and /SN1. At time T1, signal φtR is also negated to disconnect bit lines BLR and /BLR from nodes SN0 and /SN0, respectively.

At time T1, the word line WL connected to the memory cell MC of the read target is asserted. As a result, a potential corresponding to the data held by the memory cell MC is read to bit lines BLL and /BLL. The remaining word lines WL maintain the negated state, although not illustrated.

At time T1, signal SAP is asserted to start the amplifying operation of transistors 13 and 14. This generates a potential difference between nodes SN1 and /SN1 (signal development occurs). The order of assertion of signal SAP and negation of signal EQ1 may be reversed.

At time T2 after the elapse of a predetermined time from time T1, signal φt2 is asserted, and signal EQ0 is negated. As a result, nodes SN0 and /SN0 are connected to nodes SN1 and /SN1, respectively. In addition, nodes SN0 and /SN0 are disconnected from each other. Hence, the potentials of nodes SN1 and /SN1 are transferred to nodes SN0 and /SN0, respectively, At time T3, signal φtL is negated to disconnect bit lines BLL and /BLL from nodes SN1 and /SN1, respectively. At time T3, signal /SAN is asserted to start the amplifying operation of transistors 22 and 23. As a result, the potential difference between nodes SN0 and /SN0 (the potential difference between nodes SN1 and /SN1, too) within the full range. Time T3 is set after the elapse, from time T1, of a time necessary for eliminating the influence of the threshold variation between the memory cells MC and generating a potential difference between nodes SN1 and /SN1 without inversion of polarity of the read data during the amplifying operation of transistors 22 and 23.

At an appropriate timing after time T3, the word line WL connected to the memory cell MC of the read target is negated.

At time T4, signal CS is asserted to start transferring the potentials of nodes SN0 and /SN0 to the data lines DQ and /DQ. Time T4 is set after the elapse, from time T3, of a time necessary for sufficient amplification by transistors 22 and 23. The read data transfer to the data lines DQ and /DQ takes time to some degree.

A second read command is supplied two cycles after the supply of the first read command. To prepare for the second read, signal φt2 is negated at time T5 before the read data transfer to the data lines DQ and /DQ is ended so that nodes SN1 and /SN1 are disconnected from nodes SN0 and /SN0, respectively. At time T5 or (immediately) after that, signal EQ1 is asserted to start precharging nodes SN1 and /SN1.

This disconnection enables to parallelly execute the read data transfer and the precharge to prepare for the second read operation. That is, the read data transfer to the data lines DQ and /DQ is done by using nodes SN0 and /SN0, and at the same time, precharge can be executed between nodes SN1 and /SN1.

Before negation of signal φt2, the potential on nodes SN0 and /SN0 is latched by transistors 13, 14, 22, and 23. When signal φt2 is negated, transistors 13 and 14 do not contribute to latch the potential on nodes SN0 and /SN0 anymore. However, when nodes SN0 and /SN0 are connected to the data lines DQ and /DQ, transistors 51 and 52 shown in FIG. 5 contribute to latch instead in addition to transistors 22 and 23. For this reason, the potential on nodes SN0 and /SN0 is not lost. Transistors 51 and 52 are turned on after the start of potential transfer to the data lines DQ and /DQ.

At time T5, signals φtR and φtL are asserted to connect bit line BLL, node SN1, and bit line BLR to each other and connect bit line /BLL, node /SN1, and bit line /BLR to each other. At time T5, signal SAP is negated to end the amplifying operation of transistors 13 and 14. The timing of deactivating signal SAP is not limited to time T5. Signal SAP can be negated at an arbitrary timing between the restart of precharge of nodes SN1 and /SN1 and the restart of amplifying operation according to still another read command.

At time T6 after the elapse, from time T4, of a time for sufficient data transfer to the data lines DQ and /DQ, signal CS is negated to disconnect nodes SN0 and /SN0 from the data lines DQ and /DQ.

At time T7, a second read command READ2 is captured. At time T8, preparation for the second read operation starts. More specifically, at time T8, signal EQ0 is asserted to start precharging nodes SN0 and /SN0. Additionally, at time T7, signal /SAN is negated to end the amplifying operation of transistors 22 and 23.

At time T9, signal EQ1 is negated to end precharge of nodes SN1 and /SN1. Signal φtR is also negated to disconnect bit lines BLL and /BLL from nodes SN1 and /SN1. The word line WL connected to the memory cell MC of the read target is asserted, and signal SAP is asserted to generate a potential difference between nodes SN1 and /SN1. The subsequent operation is the same as in the first read.

Time T9 often comes immediately after time T8 when precharge of nodes SN0 and /SN0 starts. For this reason, precharge of nodes SN0 and /SN0 is insufficient in many cases. To prevent this, in this embodiment, nodes SN0 and /SN0 are disconnected from nodes SN1 and /SN1 during read data transfer to the data lines DQ and /DQ. With this disconnection, the read data transfer is done by nodes SN0 and /SN0, and precharge of nodes SN1 and /SN1 starts at time T5 before time T8. It is therefore possible to ensure a sufficient time for precharging nodes SN1 and /SN1 to which the read data is transferred from bit lines BLL, /BLL, BLR, and /BLR. This prevents incomplete precharge at the start of signal development for the second read. This allows to supply still another read command immediately after the preceding read command (e.g., two cycles after) to speed up the read cycle and simultaneously prevent inversion of read data.

According to the semiconductor memory device of the first embodiment, in the sense amplifier for the FBC, nodes SN0 and SN1 can be disconnected from each other, and nodes /SN0 and /SN1 can also be disconnected from each other. This enables to parallelly execute read data transfer to the data lines DQ and /DQ and precharge to prepare for the next read operation. It is therefore possible to realize a semiconductor memory device capable of simultaneously achieving high-speed read and avoidance of read data inversion.

SECOND EMBODIMENT

In the first embodiment, after nodes SN0 and /SN0 are disconnected from nodes SN1 and /SN1, the NMOSFETs in the sense amplifier and the PMOSFETs in the data buffer latch the read data. The second embodiment enables latch using only transistors in a sense amplifier.

Figure 7:
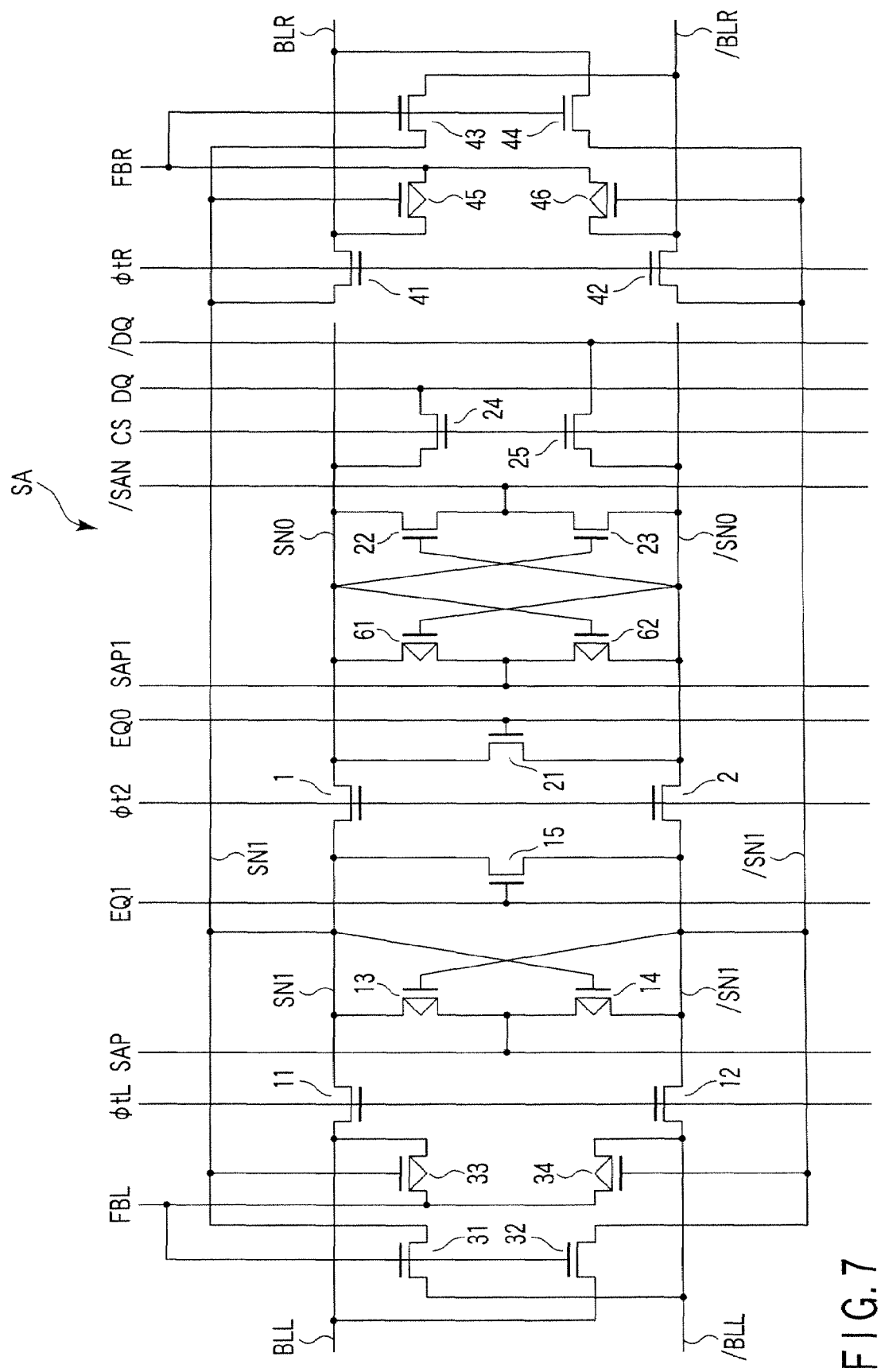
FIG. 7 is a circuit diagram showing the sense amplifier and its peripheral circuit in a semiconductor memory device according to a second embodiment.

A semiconductor memory device according to the second embodiment will be described with reference to FIGS. 7 and 8. FIG. 7 is a circuit diagram showing a sense amplifier SA and peripheral circuit in the semiconductor memory device according to the second embodiment.

As shown in FIG. 7, cross-coupled PMOSFETs 61 and 62 are provided between nodes SN0 and /SN0, in addition to the arrangement of the first embodiment. More specifically, transistors 61 and 62 are connected to each other at one terminal. The other terminal of transistor 61 is connected to the node SN0. The other terminal of transistor 62 is connected to node /SN0. The gate terminal of transistor 61 is connected to node /SN0. The gate terminal of transistor 62 is connected to node SN0. Signal SAP1 is supplied to one terminal of each of transistors 61 and 62 (the connection node between transistors 61 and 62). A controller CT shown in FIG. 4 supplies signal SAP1. The remaining components are the same as in the first embodiment.

The read operation of the sense amplifier in FIG. 7 will be described next with reference to FIG. 8. FIG. 8 is a timing chart showing the potentials of the respective units of the sense amplifier SA according to the second embodiment in a read mode. FIG. 8 exemplifies read from a memory cell MC on the left side of the sense amplifier SA, i.e., the memory cell MC connected to bit lines BLL and /BLL. The read operation according to the second embodiment is done by adding control of signal SAP1 to the first embodiment. Signal ϕtL maintains an asserted state.

Figure 8:
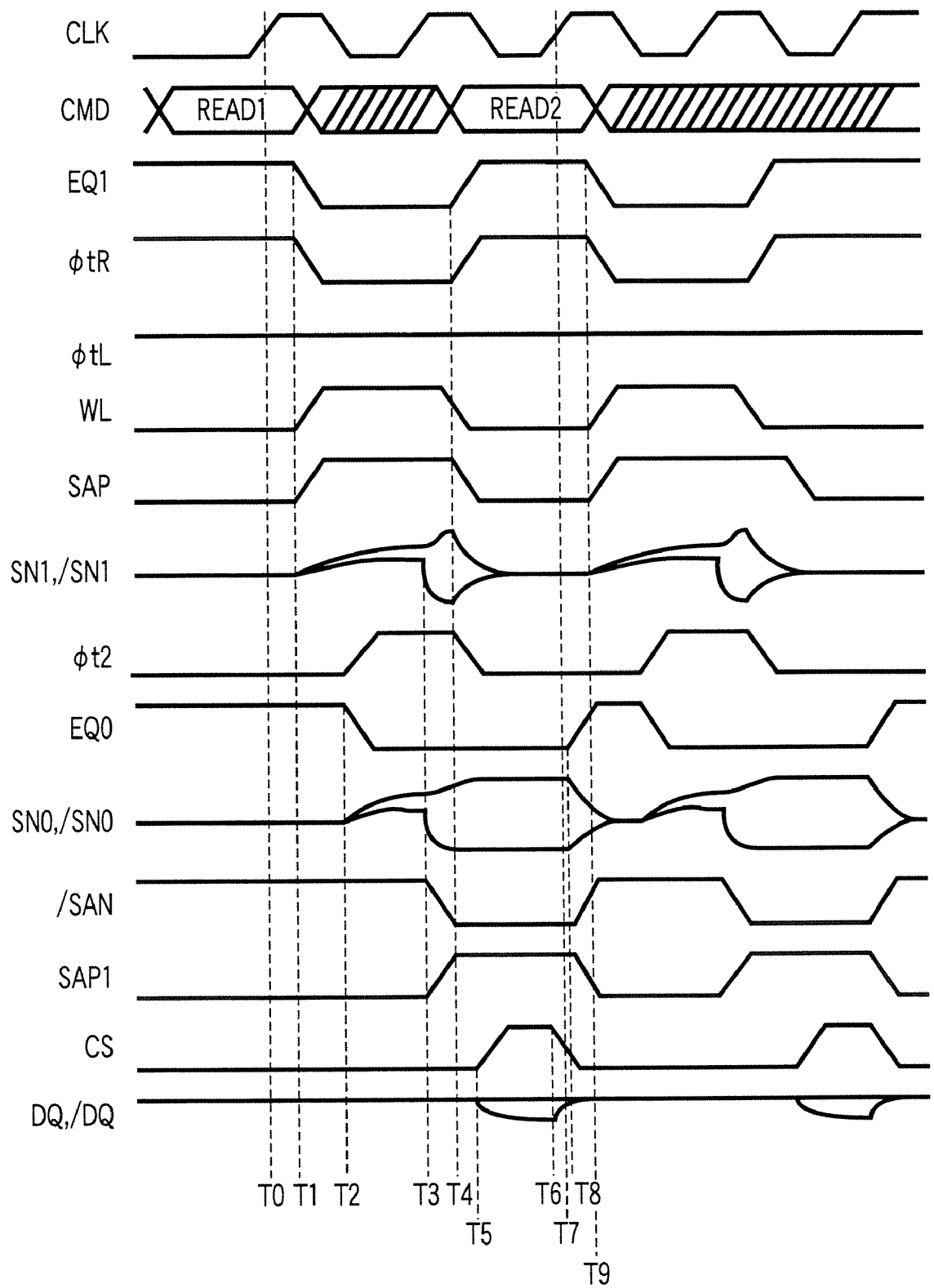
FIG. 8 is a timing chart showing the potentials of the respective units of the sense amplifier according to the second embodiment in a read mode.

As shown in FIG. 8, the operation up to time T2 is the same as in the first embodiment. In the standby state, signal SAP1 is negated. At time T3 or (immediately) after that, signal SAP1 is asserted in addition to the control of the first embodiment to make transistors 61 and 62 start operation. As a result, transistors 22, 23, 61, and 62 latch the potential on nodes SN0 and /SN0 amplified by transistors 22 and 23. Hence, even after nodes SN0 and /SN0 are disconnected from transistors 13 and 14, transistors 51 and 52 in a data buffer DQB need not be used to latch the potential on nodes SN0 and /SN0. There is no hurry for activating signal CS, and the degree of freedom in setting the assertion and negation timings of the signals including signal CS can be increased.

The operation from time T3 can be the same as in the first embodiment except that additional control to negate signal SAP1 is necessary at time T8. However, in the second embodiment, there is no hurry for activating signal CS, as described above. For this reason, FIG. 8 exemplifies a case wherein signal CS is asserted after nodes SN0 and /SN0 are disconnected from transistors 13 and 14. In other words, control at time T4 in the first embodiment changes places with control at time T5.

More specifically, at time T4, signal ϕt2 is negated to disconnect nodes SN1 and /SN1 from nodes SN0 and /SN0, respectively. At time T4 or immediately after that, signal EQ1 is asserted to start precharging nodes SN1 and /SN1. This disconnection enables to parallelly execute read data transfer and precharge to prepare for the second read operation. Additionally, at time T4, signal SAP is negated to end the amplifying operation of transistors 13 and 14. At time T4, signal ϕtR is asserted to connect node SN1 and bit line to each other and connect node /SN1 and bit line /BLR to each other. The timing of deactivating signal SAP is not limited to time T4, as in the first embodiment.

At time T5, signal CS is asserted to start transferring the potential of nodes SN0 and /SN0 to the data lines DQ and /DQ.

At times T6 and T7, the same control as in the first embodiment is performed. At time T8, signal SAP1 is negated in addition to the same control as in the first embodiment. Control at time T9 is also the same as in the first embodiment.

According to the semiconductor memory device of the second embodiment, in the sense amplifier for the FBC, nodes SN0 and SN1 can be disconnected from each other, and nodes /SN0 and /SN1 can also be disconnected from each other, as in the first embodiment. Hence, the same effect as in the first embodiment can be obtained.

According to the second embodiment, transistors 61 and 62 in the sense amplifier SA are used to latch the potential on nodes SN0 and /SN0. Hence, even after nodes SN0 and /SN0 are disconnected from transistors 13 and 14, it is unnecessary to connect nodes SN0 and /SN0 to the data buffer DQB to latch the potential on nodes SN0 and /SN0. Hence, the degree of freedom of signal assertion and negation timings increases.

According to the embodiments of the present invention, it is possible to provide a semiconductor memory device having an improved sense amplifier for an FBC.

Those skilled in the art can hit upon various changes and modifications within the spirit and scope of the present invention, and the present invention can incorporate even those changes and modifications.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a first memory cell and a second memory cell each of which includes an electrically floating body region and stores data in accordance with the number of majority carriers in the body region, the first memory cell and the second memory cell storing data with opposite polarities;
   a first isolation transistor which has one terminal serving as a first node connected to the first memory cell and the other terminal serving as a second node;
   a second isolation transistor which has one terminal serving as a third node connected to the second memory cell and the other terminal serving as a fourth node;
   a first amplification transistor of a first conductivity type, which has one terminal connected to the first node and a gate electrode connected to the third node;
   a second amplification transistor of the first conductivity type, which has one terminal connected to the third node, the other terminal connected to the other terminal of the first amplification transistor, and a gate electrode connected to the first node;
   a third amplification transistor of a second conductivity type, which has one terminal connected to the second node and a gate electrode connected to the fourth node;
   a fourth amplification transistor of the second conductivity type, which has one terminal connected to the fourth node, the other terminal connected to the other terminal of the third amplification transistor, and a gate electrode connected to the second node; and
   an equalizing transistor which is connected between the first node and the third node.

2. The device according to claim 1, wherein
   before a first time, the first amplification transistor and the second amplification transistor in an OFF state are turned on, and the equalizing transistor in an ON state is turned off, at a second time after the first time, the first isolation transistor and the second isolation transistor in the OFF state are turned on, at a third time after the second time, the third amplification transistor and the fourth amplification transistor in the OFF state are turned on, at a fourth time after the third time, the first isolation transistor and the second isolation transistor are turned off, and at a fifth time equal to or after the fourth time, the equalizing transistor is turned on.

3. The device according to claim 2, further comprising:

a first data line which is connected to the second node via a first transfer transistor;

a second data line which is connected to the fourth node via a second transfer transistor;

a fifth amplification transistor of the first conductivity type, which has one terminal connected to the first data line and a gate electrode connected to the second data line; and a sixth amplification transistor of the first conductivity type, which has one terminal connected to the second data line, the other terminal connected to the other terminal of the fifth amplification transistor, and a gate electrode connected to the first data line, and wherein at a sixth time between the third time and the fourth time, the first transfer transistor and the second transfer transistor in the OFF state are turned on, and at a seventh time between the sixth time and the fourth time, the fifth amplification transistor and the sixth amplification transistor are turned on.

4. The device according to claim 3, further comprising:

a third isolation transistor which is connected between the first memory cell and said one terminal of the first amplification transistor; and a fourth isolation transistor which is connected between the second memory cell and said one terminal of the second amplification transistor, and wherein at the third time, the third isolation transistor and the fourth isolation transistor in the ON state are turned off, and at the fourth time, the third isolation transistor and the fourth isolation transistor are turned on.

5. The device according to claim 1, further comprising:

a fifth amplification transistor of the first conductivity type, which has one terminal connected to the second node and a gate electrode connected to the fourth node; and a sixth amplification transistor of the first conductivity type, which has one terminal connected to the fourth node, the other terminal connected to the other terminal of the fifth amplification transistor, and a gate electrode connected to the second node.

6. The device according to claim 5, wherein before a first time, the first amplification transistor and the second amplification transistor in an OFF state are turned on, and the equalizing transistor in an ON state is turned off, at a second time after the first time, the first isolation transistor and the second isolation transistor in the OFF state are turned on, at a third time after the second time, the third amplification transistor and the fourth amplification transistor in the OFF state are turned on, at a fourth time equal to or after the third time, the fifth amplification transistor and the sixth amplification transistor in the OFF state are turned on, at a fifth time after the fourth time, the first isolation transistor and the second isolation transistor are turned off, and at a sixth time equal to or after the fifth time, the equalizing transistor is turned on.

7. A semiconductor memory device comprising:

a first memory cell and a second memory cell each of which includes an electrically floating body region and stores data in accordance with the number of majority carriers in the body region, the first memory cell and the second memory cell storing data with opposite polarities;

a first isolation transistor which has one terminal serving as a first node connected to the first memory cell and the other terminal serving as a second node;

a second isolation transistor which has one terminal serving as a third node connected to the second memory cell and the other terminal serving as a fourth node;

a first amplification transistor of a first conductivity type, which has one terminal connected to the first node and a gate electrode connected to the third node;

a second amplification transistor of the first conductivity type, which has one terminal connected to the third node, the other terminal connected to the other terminal of the first amplification transistor, and a gate electrode connected to the first node;

a third amplification transistor of a second conductivity type, which has one terminal connected to the second node and a gate electrode connected to the fourth node;

a fourth amplification transistor of the second conductivity type, which has one terminal connected to the fourth node, the other terminal connected to the other terminal of the third amplification transistor, and a gate electrode connected to the second node;

a fifth amplification transistor of the first conductivity type, which has one terminal connected to the second node and a gate electrode connected to the fourth node;

a sixth amplification transistor of the first conductivity type, which has one terminal connected to the fourth node, the other terminal connected to the other terminal of the fifth amplification transistor, and a gate electrode connected to the second node;

a first equalizing transistor which is connected between the first node and the third node; and a second equalizing transistor which is connected between the second node and the fourth node.

8. The device according to claim 7, wherein before a first time, the first amplification transistor and the second amplification transistor in an OFF state are turned on, and the first equalizing transistor in an ON state is turned off, at a second time after the first time, the first isolation transistor and the second isolation transistor in the OFF state are turned on, and the second equalizing transistor in the ON state is turned off, at a third time after the second time, the third amplification transistor and the fourth amplification transistor in the OFF state are turned on, at a fourth time equal to or after the third time, the fifth amplification transistor and the sixth amplification transistor in the OFF state are turned on, at a fifth time after the fourth time, the first isolation transistor and the second isolation transistor are turned off, and at a sixth time equal to or after the fifth time, the first equalizing transistor is turned on.

9. The device according to claim 8, further comprising:

a first data line which is connected to the second node via a first transfer transistor;

a second data line which is connected to the fourth node via a second transfer transistor;

a seventh amplification transistor of the first conductivity type, which has one terminal connected to the first data line and a gate electrode connected to the second data line; and an eighth amplification transistor of the first conductivity type, which has one terminal connected to the second data line, the other terminal connected to the other terminal of the seventh amplification transistor, and a gate electrode connected to the first data line, and wherein at a seventh time after the sixth time, the first transfer transistor and the second transfer transistor in the OFF state are turned on, and after the seventh time, the fifth amplification transistor and the sixth amplification transistor are turned on.

10. The device according to claim 9, further comprising:

a third isolation transistor which is connected between the first memory cell and said one terminal of the first amplification transistor; and a fourth isolation transistor which is connected between the second memory cell and said one terminal of the second amplification transistor.

* * * * *